United States Patent [19]
Mohara et al.

[11] Patent Number: 4,984,354
[45] Date of Patent: Jan. 15, 1991

[54] ELECTRONIC PARTS MOUNTING APPARATUS

[75] Inventors: Masayuki Mohara; Yoshinori Kano, both of Gunma, Japan

[73] Assignee: Sanyo Electric Co., Ltd., Osaka, Japan

[21] Appl. No.: 515,947

[22] Filed: Apr. 27, 1990

[30] Foreign Application Priority Data

Apr. 28, 1989 [JP] Japan .................................. 1-110009
Aug. 7, 1989 [JP] Japan .................................. 1-204469

[51] Int. Cl.⁵ .............................................. H05K 3/30
[52] U.S. Cl. ......................................... 29/740; 29/759
[58] Field of Search .................. 29/740, 741, 714, 759, 29/833, 834–836

[56] References Cited

U.S. PATENT DOCUMENTS 4,706,379 11/1987 Seno et al. .
4,727,647 3/1988 Matson et al. .
4,794,689 1/1989 Seno et al. .

OTHER PUBLICATIONS

IBM Technical Disclosure Bulletin, vol. 22, No. 7, Dec. 1979, "Multiple Size Chip Pickup, Orientation and Placement Station", Hoebener, pp. 2757–2761.

*Primary Examiner*—Carl E. Hall
*Attorney, Agent, or Firm*—Armstrong, Nikaido, Marmelstein, Kubovcik & Murray

[57] ABSTRACT

An electronic parts mounting apparatus, which on the basis of a recognition result of an attitude of a tipped electronic part held on a removing nozzle obtained by a recognition device, rotates the nozzle to change the attitude of the rotational direction of the electronic part. The apparatus comprises a removing nozzle formed in its upper portion with a groove to be fitted to attract and hold the electronic part recognized by the recognition device, a vertically movable and rotatable nozzle rotating means for changing the attitude of the electronic parts in a rotational direction, a cushion means mounted on the nozzle rotating means or the removing nozzle for pressing the fitting portion against the groove to be fitted, and a sliding means for for fitting the fitting portion into the groove to be fitted while sliding the fitting portion.

4 Claims, 7 Drawing Sheets

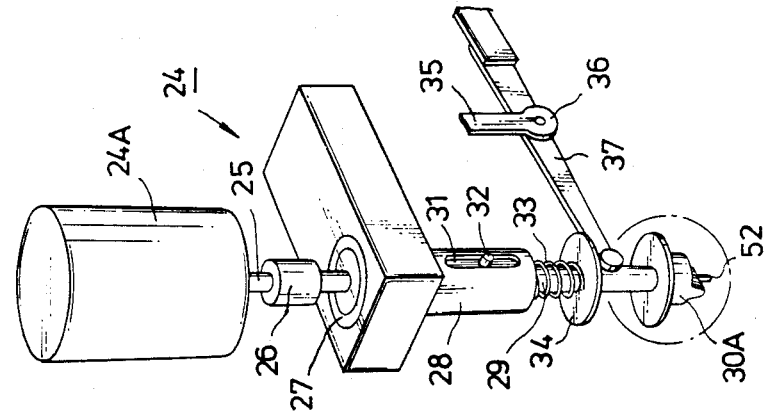
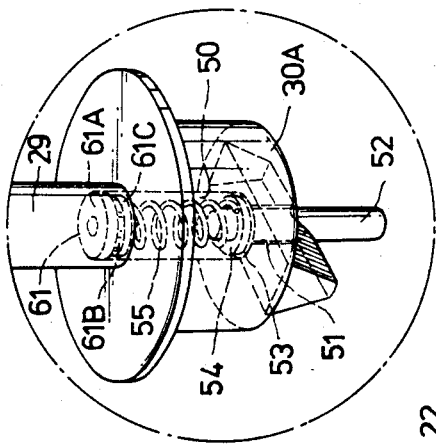
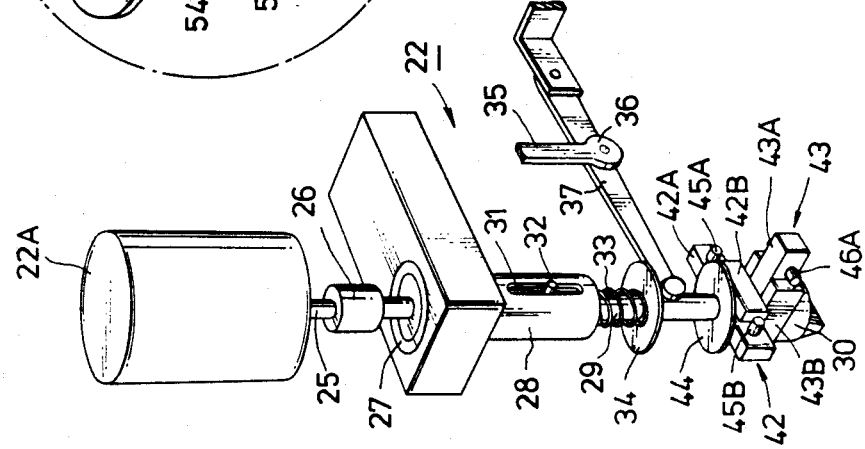

ELECTRONIC PARTS MOUNTING APPARATUS

BACKGROUND OF THE INVENTION (1) Field of the Invention

The present invention relates to an electronic parts mounting apparatus, which on the basis of a recognition result of an attitude of a tipped electronic part held on a removing nozzle obtained by a recognition device, rotates said nozzle to change the attitude of the rotational direction of said part.

(2) Prior Art

U.S. Pat. No. 4,747,198 discloses in its specification and drawings a technique in which a driving rotational member is fitted in an inner peripheral frictional surface of a driven rotational member of an attraction head. Thereafter, an extended member of the driving rotational member is extended into frictional engagement with the inner peripheral frictional surface to rotate an attraction pipe of the attraction head to change the rotational attitude of electronic parts.

However, in the event that rotational centers of the driving rotational member and the driven rotational are not coincided with each other, a radial strain occurs during rotation, and an error in rotational transmission results.

Accordingly, it is necessary to provide an arrangement wherein even if the rotational centers of the driving rotational member and the driven rotational member are not coincided with each other, a radial strain does not occur during rotation, and positive rotational transmission is performed.

SUMMARY OF THE INVENTION

According to the present invention, there is provided an apparatus comprising a removing nozzle formed at an upper portion with a groove, a vertically movable and rotatable nozzle rotating means positioned above the removing nozzle and having a fitting portion fitted in the groove in the removing nozzle, a cushion means mounted on the nozzle rotating means or the removing nozzle for pressing said fitting portion against the groove when the nozzle rotating means is moved downward and the fitting portion comes into contact with the groove of the nozzle, and a sliding means for sliding the fitting portion at least in one direction while being adjusted to the groove by the urging force of the cushion means.

With the above-described arrangement, when the nozzle rotating means is moved downward, the fitting portion is brought into contact with the groove of the removing nozzle.

At that time, the fitting portion and the groove are urged so that they are pressed by the cushion means mounted on the nozzle rotating means or the removing nozzle, and the fitting portion is slidably moved while being adjusted to the groove by the sliding means.

BRIEF DESCRIPTION OF THE DRAWINGS

FIG. 5 is a perspective view of a first nozzle rotation positioning device;

FIG. 6 is a partly sectional view of FIG. 5;

FIG. 7 is a perspective view of a third nozzle rotation positioning device;

FIG. 8 is a partly enlarged view of FIG. 7;

DETAILED DESCRIPTION OF THE PREFERRED EMBODIMENTS

Embodiments of the present invention will be described in greater detail with reference to the drawings.

Figure 1:
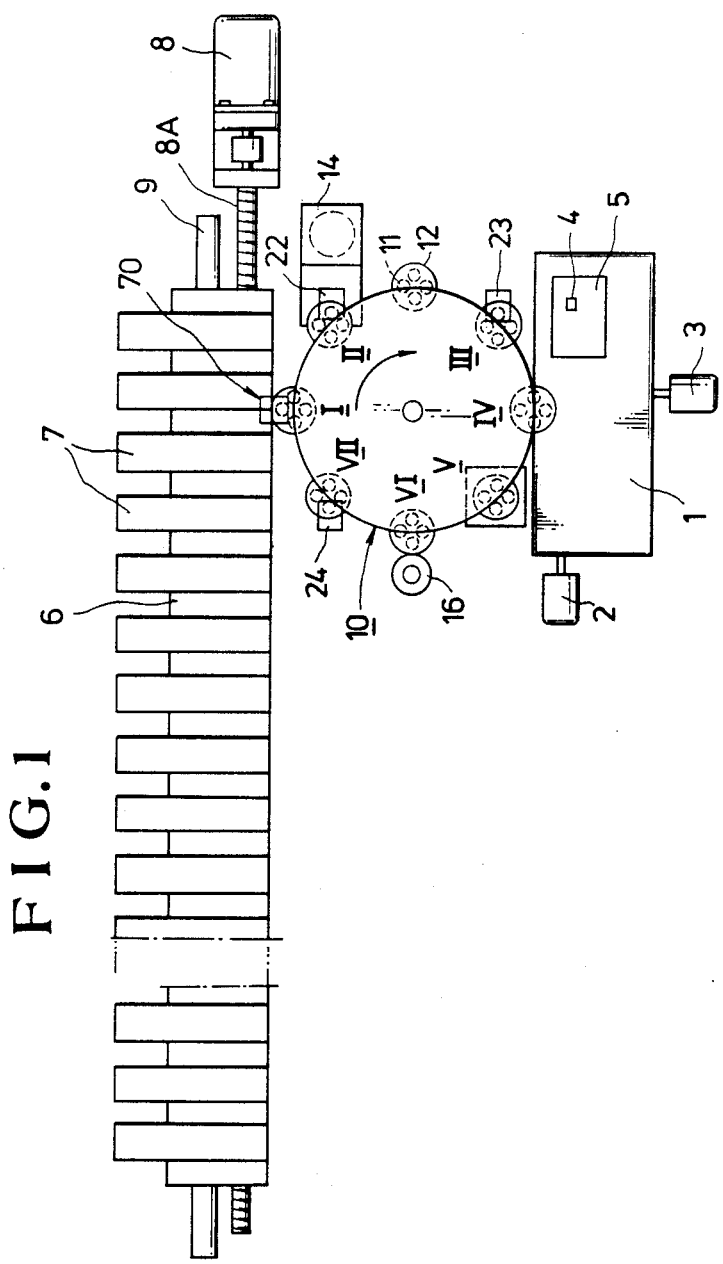
FIGS. 1 and 9 are a plan view and a circuitry view, respectively, of an electronic parts automatic mounting apparatus to which the present invention is applied.

Reference numeral 1, FIG. 1, designates an XY table which is moved in X and Y directions by the drive of an X-axis servo motor 2 and a Y-axis servo motor 3. A print substrate 5, on which a tipped electronic part 4 (hereinafter referred to as a tipped part 4) is mounted, is placed on the XY table 1.

Reference numeral 6 designates a part supply bed on which a number of part supply devices 7 are juxtaposed, the part supply bed 6 being moved in an X direction (a lateral direction in FIG. 1) while being guided by a guide rod 9 by rotation of ball threads 8A by the drive of a part supply portion servo motor 8.

Reference numeral 10 designates a rotary disk on which is provided a number of attraction head portions 12 as a removing head portion on which are provided a plurality of attraction nozzles 11 as removing nozzles for removing and carrying tipped parts 4 from the part supply devices 7. Rotary disk 10 is intermittently rotated by a rotary disk servo motor 13 shown in FIG. 9.

Figure 10:
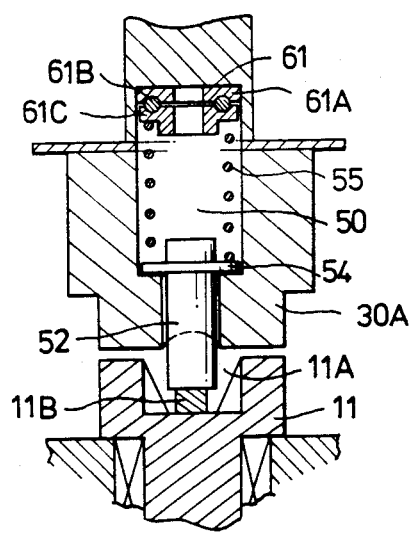
FIGS. 10 and 11 illustrate the fitting between a fitting portion and a groove to be fitted.
Figure 11:
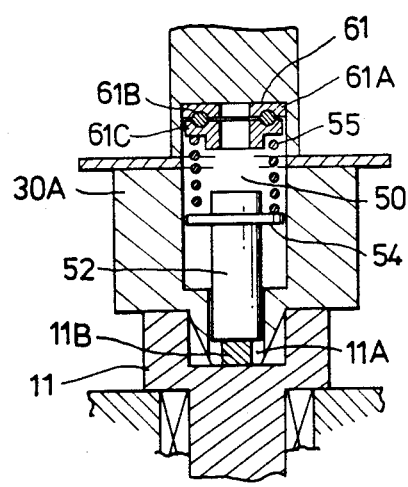
Figure 12:
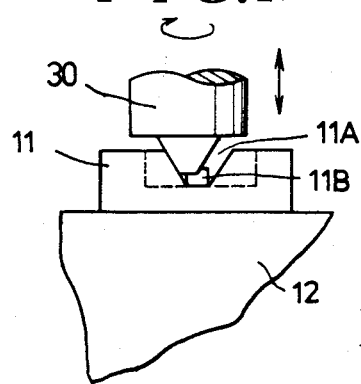
FIG. 12 is a view showing the eccentric state between the fitting portion and the groove to be fitted.

The attraction nozzle 11 is provided in its upper portion with a groove 11A (see FIGS. 3 and 4) in which is fitted a fitting portion 30 which will be described later and a portion 11B (see FIGS. 10, 11 and 12) with which is contacted a contacting rod 52 which will be described later. It is to be noted that the groove 11A may also be provided with 90° side walls.

Reference character I, FIG. 1, designates an attraction station for removing the tipped parts 4 from the part supply devices 7.

Reference character II, FIG. 1, designates a first nozzle rotation correcting station wherein the state of the tipped part 4, attracted on an attraction nozzle 11 is recognized by a recognition device 14 and correction of rotation of the tipped part 4 is effected on the basis of the result obtained by such recognition. In the first nozzle rotation correcting station II, the tipped parts 4 having leads such as SOP (Small Outline Package), QFP (Quad Flat Package), and the like, are corrected.

Reference character III, FIG. 1, designates a second nozzle rotation correcting station for performing correction of rotation of the tipped parts 4, without lead, such as, LCC (Leadless Chip Carrier). Correction is not effected in the first nozzle rotation correction station II on the basis of result of the recognition obtained by the recognition device 14 but is effected in the station III.

Reference character IV, FIG. 1, designates a mounting station for mounting, on a print substrate 5, the tipped parts 4 which have been already processed by the first nozzle rotation correcting station II or the second nozzle rotation correcting station III.

Reference character V, FIG. 1, designates an ejecting station for ejecting the tipped parts 4 which should not be mounted, for example, where the tipped part is attracted in an upright position or the attracted tipped part 4 is not standard.

Reference character VI, FIG. 1, designates a nozzle selecting station for selecting an attraction nozzle 11, corresponding to the tipped part 4 to be attracted in the attraction station I. The attraction nozzle is moved by a drive system, not shown, to a gear (not shown) provided on the outer diametral portion of the attraction head portion 12 and meshed with such gear, after which the desired attraction nozzle 11 is selected by the rotation of a drive gear 16 as a nozzle selecting means caused by the rotation of a drive gear servo motor 15 (see FIG. 9).

Reference character VII, FIG. 1, designates a nozzle origin positioning station for adjusting an origin position of a rotational direction of the attraction nozzle 11 while being adjusted to the direction of the tipped part 4 at a stand-by position when the tipped part 4 is removed by the attraction nozzle 11 in the attraction station I.

The aforementioned rotary disk 10 will be described with reference to FIG. 2.

Figure 2:
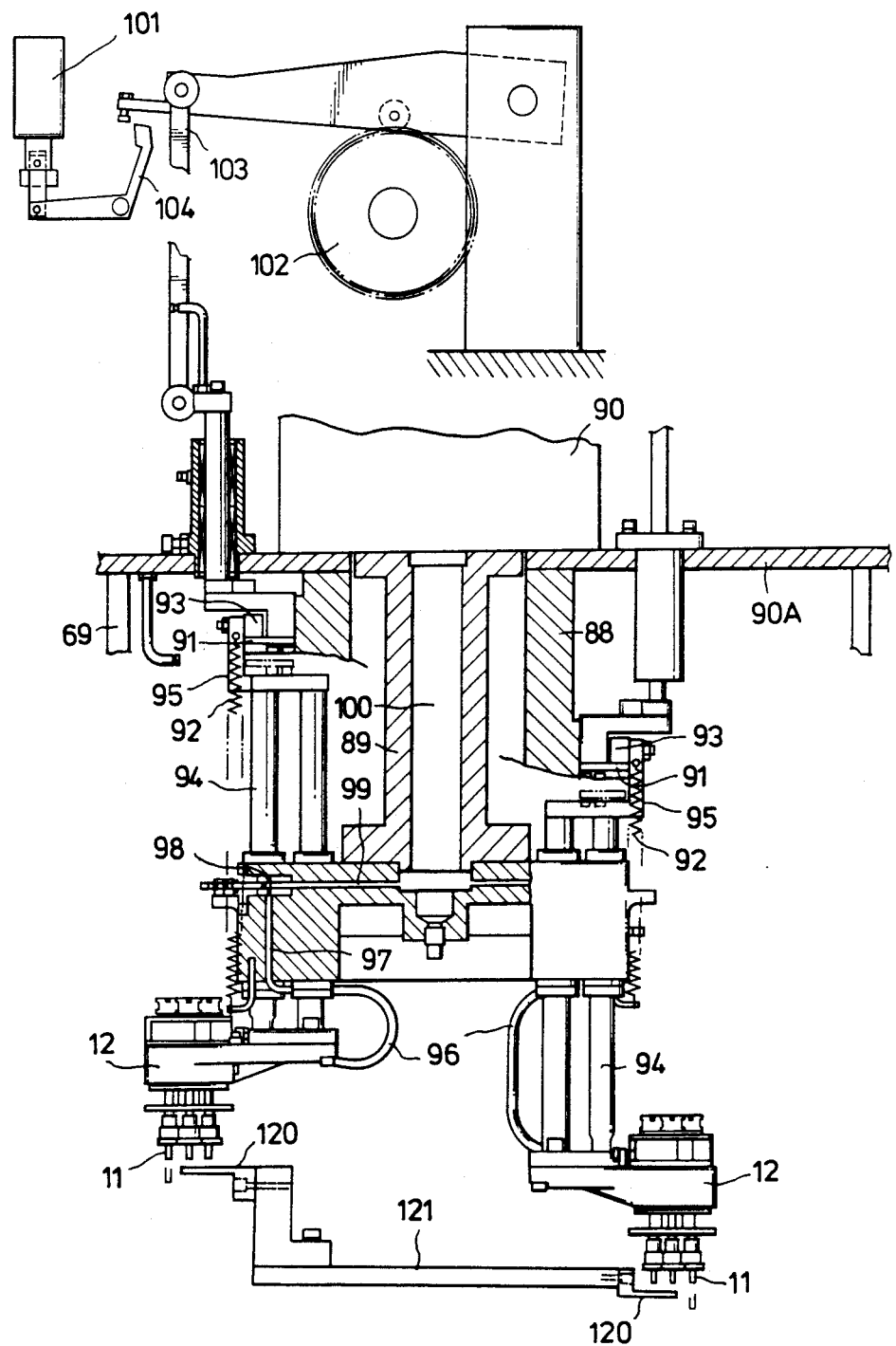
FIG. 2 is a partly sectional view of a rotary plate.

Reference numeral 88, FIG. 2, designates a hollow cylindrical cam member for guiding a rotary disk suspended and secured to a mounting bed 90A of an index unit 90 so as to surround an upper portion of a cylindrical portion 89 formed above the rotary disk 10. In the peripheral side at the lower end of the cam member 88, a cam 91 is formed over the generally entire periphery. A roller 93, provided as a sliding portion on the upper end of each of the attraction head portions 12 is rotated while being urged against the upper surface of the cam 91 by means of a spring 92. The attraction head portion 12 is moved upward and downward along the contour of the cam 91 and rotates along with the rotary disk 10. A pair of guide rods 94 stand upright on each of the attraction head portions 12 and are vertically movably through the rotary disk 10. Mounting member 95, on which the roller 93 is rotatably provided, is secured to the upper end of rods 94. Accordingly, each of the attraction head portions 12 is vertically movably supported on the rotary disk 10. When the attraction head portion 12 is moved downward, the tipped part 4, FIG. 1, is attracted in the attraction station I, and in the mounting station IV, when the tipped part 4 is mounted on the print substrate 5, the plurality of attraction nozzles 11 are defined by a stopper plate 120, FIG. 2, provided on a base 121 of the body of the electronic parts automatic mounting apparatus so that those other than the desired single attraction nozzle 11, among the plurality of attraction nozzles 11, are not moved downward. Connector hose 96 is connected at one end to a vacuum pump not shown. Each of the hoses 96 has the other end connected to a connection hose 97 which extends through and is embedded in the rotary disk 10 connector hose 97 is connected to the vacuum pump through a switching valve 98, a laterally extending intake passage 99 and a central intake passage 100.

Reference numeral 101, FIG. 2, designates a suction type attraction clutch solenoid which defines the downward movement of the attraction head portion 12 in the attraction station I, if necessary, to stop the attraction. Attraction clutch solenoid 101, having a contacting lever 104 in contact with an attraction head portion vertically movable lever 103 so that the latter is not moved downward by the drive of a cam mechanism 102. That is, when the clutch solenoid 101 is deenergized, the contacting lever 104 contacts the vertically movable lever 103 so as to preclude the vertically movable lever 103 from downward movement. This structure is also provided in the mounting station IV.

Next, the nozzle positioning device 70 in the attraction station I will be described with reference to FIG. 3.

Figure 3:
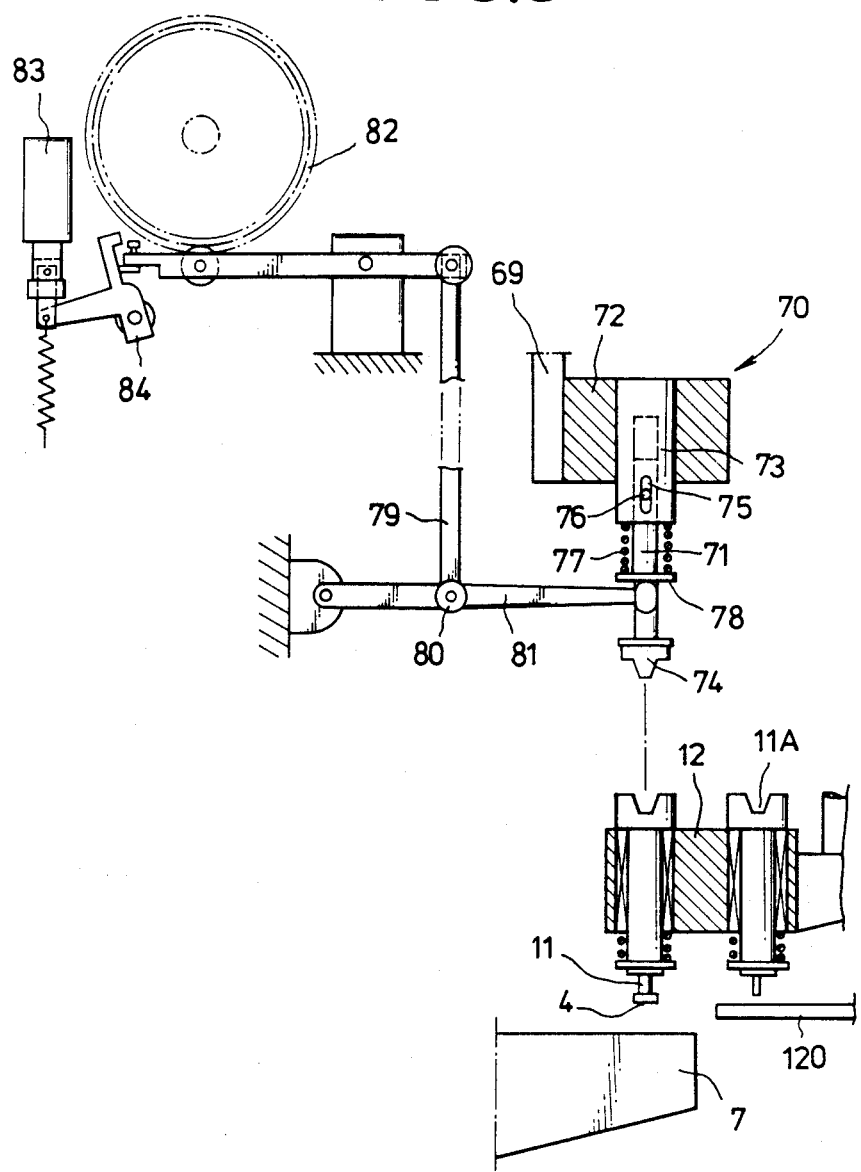
FIG. 3 is a side view of an attraction station.

Reference numeral 71, FIG. 3, designates a nozzle positioning rod which is vertically movably fitted into a nozzle positioning member 73 mounted on a retainer 72 secured to a mounting plate 69 suspended from and secured to the mounting bed 90A, FIG. 2. Nozzle positioning rod 71 has a nozzle positioning fitting portion 74. Pin 76 projects outwardly from a longitudinal slot 75 provided in the nozzle positioning member 73. The fitting portion 74 is formed to be narrowed in width toward the lower end thereof so as to bit into the groove 11A. The positioning rod 71 is provided with an engaging portion 78 engaging a spring 77 as a cushion means relative to the bottom surface of the nozzle positioning member 73. Engaging portion 78 is engaged by a pivotal lever 81 mounted through a rod end 80 on a vertically movable lever 79 which is vertically moved by a cam mechanism 82 so that the pivotal lever 81 is rotated as the vertically movable lever 70 moves up and down whereby the nozzle positioning rod 71 is moved up and down while being urged by the spring 77.

Reference numeral 83 designates a positioning clutch solenoid which, with contacting lever 84, defines the downward movement of the nozzle positioning device 70 caused by the downward movement of the vertically movable lever 79.

The recognition device 14 provided in the first nozzle rotation correcting station II, FIG. 1, will be described hereinafter with reference to FIG. 4.

Figure 4:
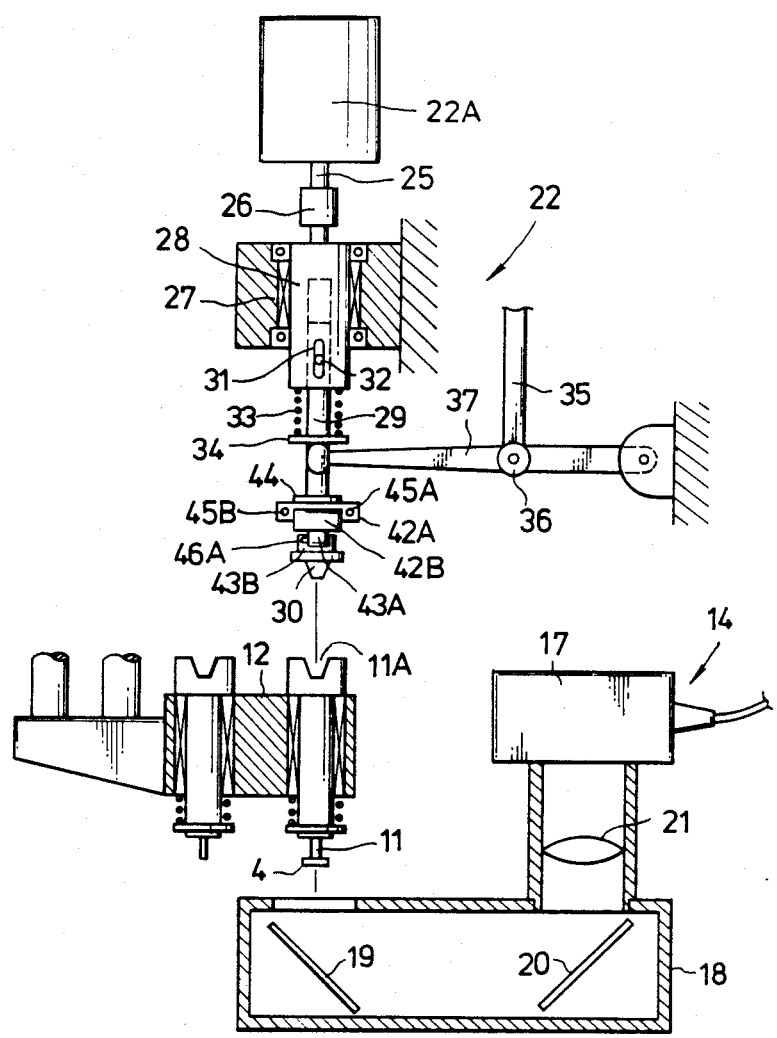
FIG. 4 is a side view of a first nozzle rotation correcting station.

Reference 17, FIG. 4, designates a CCD camera for viewing the tipped part 4 attracted by the attraction nozzle 11. A viewing image is obtained by reflection in two mirrors 19 and 20 mounted within a box 18 below the tipped part 4 and is reflected upwardly of the recognition device 14 through a lens 21. That is, light from a light source, not shown, is irradiated on the tipped part 4 through a diffusion plate, and a silhouette image is photographed by the CCD camera and recognized by the recognition device 14.

Next, the first and second nozzle rotation positioning devices 22 and 23 in the first and second nozzle rotation correcting stations II and III, FIG. 1, will be described in detail. Since the devices 22 and 23 have the same construction, the first nozzle rotation positioning device 22 will be described with reference to FIGS. 5 and 6.

Reference numeral 22A, FIG. 5, designates a first nozzle rotating motor as a drive source for the θ rotation of the attraction nozzle 11. A nozzle rotating rod 29, described later is vertically movably mounted on a nozzle rotating member 28 fitted in a bearing member 27 through a coupling 26 in an output shaft 25. The nozzle rotating rod 29 may be moved up and down by use of a ball spline.

The nozzle rotating rod 29 has a nozzle rotating fitting portion 30 at a lower end fitted into the nozzle rotating member 28, and there is provided a pin 32 projected outwardly from a longitudinal slot 31 provided in the nozzle rotating member 28. The nozzle rotating fitting portion 30 is formed to be narrowed in width toward the lower end thereof so as in the groove to be fitted 11A, FIG. 4. The nozzle rotating rod 29 is provided with an engaging portion 34 for engaging a spring 33 as a cushion means relative to the bottom surface of the nozzle rotating member 28, the engaging portion 34 being engaged by a pivotal lever 37 mounted through a rod end 36 on a vertically movable lever 35 which is vertically moved by a cam as a drive, not shown, so that the nozzle rotating rod 29 is moved up and down while being urged by the spring 33 by the vertical pivotal movement of the pivotal lever 37 as the vertically movable lever 35 moves up and down.

Reference numerals 42 and 43 designate an X-direction linear guide and a Y-direction linear guide, respectively, are provided above the nozzle rotating fitting portion 30. A rail 42A of the X-direction linear guide 42 is secured to a linear guide engaging portion 44 provided at the lower end of the nozzle rotating rod 29, a rail 43A of the Y-direction linear guide 43 is secured to a movable block 42B of the linear guide 42, and the fitting portion 30 is secured to a movable block 43B of the linear guide 43. The linear guides 42 and 43 are provided with stoppers 45A, 45B and 46A which define the pivotal movement within the range of the groove 11A to be fitted.

Next, the third nozzle rotation positioning device 24 in the nozzle origin positioning station VII will be described with reference to FIGS. 7 and 8. The construction similar to that of the aforementioned first nozzle rotation positioning device 22 is indicated by the same reference numerals, description of which will be omitted.

The nozzle rotating fitting portion 30A provided in the nozzle rotating rod 29 is interiorly provided with a first cavity 50 and a second cavity 51 having a smaller diameter than that of the first cavity 50.

Contacting rod brake means 52 is rotatably engaged with the fitting portion 30A urged against a shoulder 53 of the first cavity 50 and the second cavity 51 by a spring 55 at an engaging portion 54 thereof. Contacting rod brake means 52 extends downward from the lower end of the fitting portion 30A. The extreme end of contacting rod 52 contacts the portion 11B, FIGS. 10-12 within groove fitted 11A to release engagement between shoulder 53, FIG. 8, and engaging portion 54 whereby, when the fitting portion 30A rotates, the contacting rod 52 does not follow such rotation but idly rotates. In order to assist the idling of the contacting rod 52, a thrust bearing 61, FIGS. 8 and 10 receiving a spring 55, is provided on the upper surface of the first cavity 50, that is, on the spring 55 receiving side of the nozzle rotating rod 29, so that the turning force is not transmitted to the contacting rod 52 due to the torsion of the spring 55 resulting from the rotation of the nozzle rotating rod 29.

Figure 9:
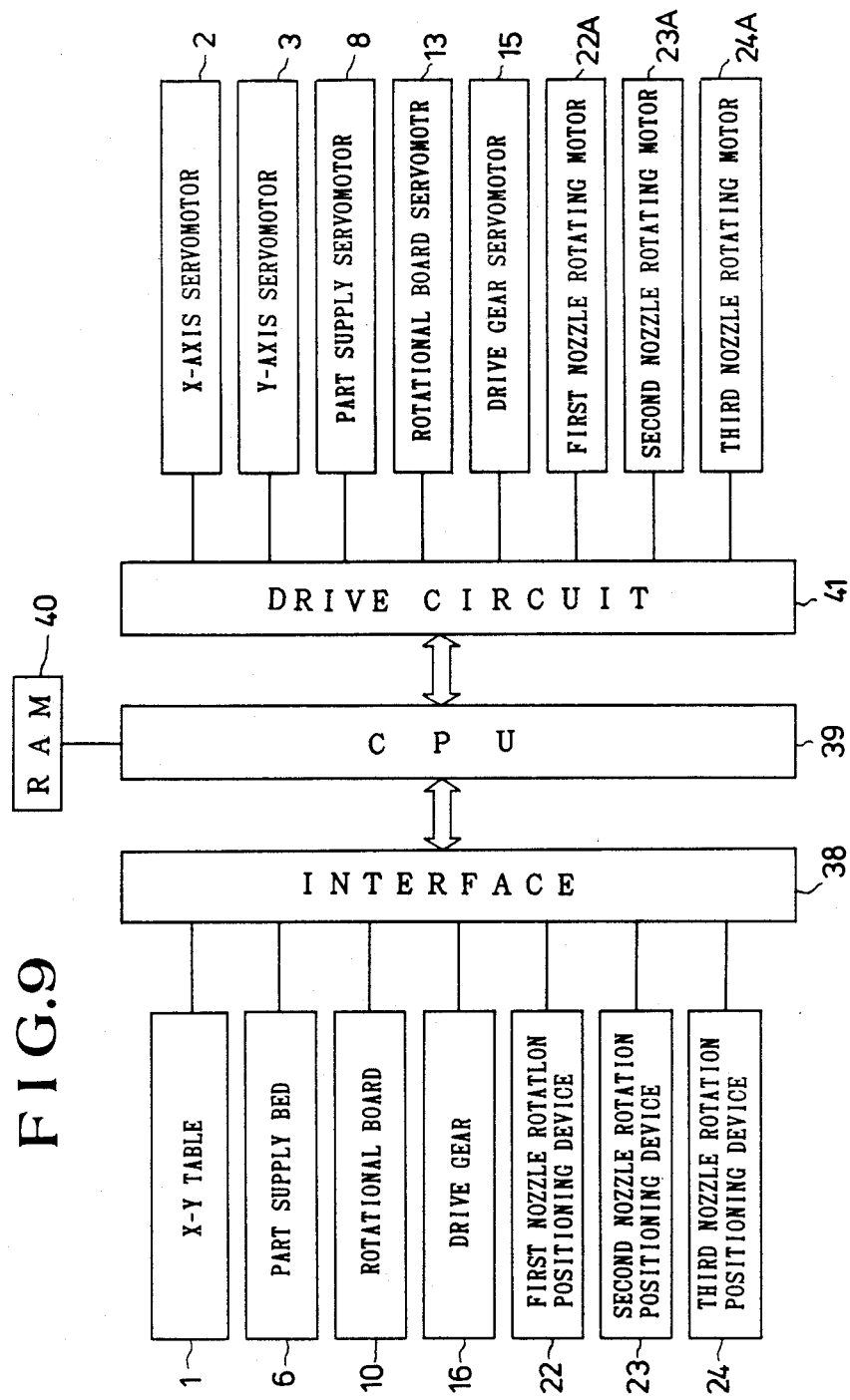

In FIG. 9, reference numeral 38 designates an interface, to which are connected the XY table 1, part supply bed 6, rotary disk 10, drive gear 16 and first, second and third nozzle rotation positioning devices 22, 23 and 24. Each of these control elements is subjected to program controlling by a CPU 39 as a control device. Reference numeral 40 designates a RAM as a memory, which stores, in fixed areas thereof, data of rotational center of the attraction nozzles, data of recognition positions of the tipped parts 4 obtained by the recognition device 14 and data of mounting positions (X, Y and θ directions) on the print substrate 5 of the tipped parts 4.

It is to be noted that because the set position of the rotational center of the attraction nozzle 11 is possibly deviated, due to a change in temperature, a change with passage of time or the like, when a temperature exceeds a certain set level or after passage of certain time, the attraction nozzle 11, with the tipped part 4 not attracted thereon, is recognized by the recognition device 14 to calculate an amount of deviation of the rotational center of the attraction nozzle to re-store the calculated amount of deviation in the RAM 40 or to add the amount of deviation to the data of rotational center of the attraction nozzle 11.

A drive circuit 41 is connected to the CPU 39, and the X-axis servo motor 2, Y-axis servo motor 3, part supply portion servo motor 8, rotary disk servo motor 13, drive gear servo motor 15 and first, second and third nozzle rotating motors 22A, 23A and 24A.

The operation of the apparatus will be described in detail with reference to the drawings.

First, in the mounting operation, the recognition device 14 recognizes a position of rotational center of the attraction nozzle 11 (using, as a reference, a reference point of an image center of the CCD camera 17 or the like), and data of the rotational center position is stored in the RAM 40.

In operation of recognizing the center position of the attraction nozzle 11, a jig is attracted by the attraction nozzle 11, and the jig is rotated as the attraction nozzle 11 rotates. A hole provided in the jig being rotated is recognized by the recognition device 14 at a position of a rotational angle of the attraction nozzle 11. The rotational center of the attraction nozzle 11 may be obtained by a computer, not shown, in accordance with the recognition result.

Further, trial-striking of the tipped part 4 is actually carried out while varying the mounting angle. The amount of deviation between the mounting position and the rotational center of the attraction nozzle 11 is measured and the measured value may be inputted into the RAM 40 by an input device.

The part supply bed 6 is moved to the attraction station I by the drive of the part supply portion servo motor 8, and the desired part supply device 7 stands-by at the part removing position. Then, the attraction nozzle 11 is moved above the tipped part 4 received in the part supply device 7 to attract and hold the tipped part 4 at the lower end of the attraction nozzle 11, as shown in FIG. 3. In the station I, the lower end of the attraction nozzle 11 of the attraction head portion 12 is moved down to the position of the tipped part 4 received in the part supply device 7. This may be done by placing the roller 93 at the upper end of the head portion 12, on vertically movable upper and lower rails (not shown), disposed in a disconnected portion of the cam 91 of the cam member 88, and permitting the upper and lower rails to move down. At that time, the attraction nozzle 11 may rotate due to the shock when the tipped part 4 is attracted, the vertical movement of the attraction nozzle 11 and the like. As the result, the origin position, adjusted in the origin positioning station VII sometimes deviates so that an unevenness in direction of the groove to be fitted 11A is produced. Thus, an error occurs at the time of the succeeding correction of rotation. This may be prevented in the following operation. That is, in attracting the tipped part 4, the vertically movable lever 70 is moved down by the drive of the cam mechanism 82. The pivotal lever 81 is swung downward, and the nozzle positioning fitting portion 74 is placed in contact with a tapered portion of the groove to be fitted 11A provided in the upper portion of the attraction nozzle 11, while being urged by the spring 77. The lower end of the attraction nozzle 11 is moved down along with the attraction head portion 12 to the position of the tipped part 4 received in the part supply device 7 with the fitting portion 74 fitted in the groove 11A (here, the remaining attraction nozzles 11 are precluded from downward movement by the stopper plate 120). Thus, the tipped part 4 is attracted by the attraction nozzle 11 in the state where the rotation of the attraction nozzle 11 caused by the shock when the tipped part 4 is attracted and the vertical movement of the attraction nozzle 11, and the like, as mentioned above, is controlled.

Next, the operation for correcting rotation of the tipped part 4 in a $\theta$ direction in the first nozzle rotation correcting station II will be described.

The position of the tiped part 4, from the image center of the CCD camera 17 attracted by the attraction nozzle 11, is recognized by the recognition device 14, and the recognized data ($X_1$, $Y_1$ and $\theta_1$) are stored in the RAM 40. The operation of correction, in connection with the angle data ($\theta$), is described below.

The recognition angle data ($\theta_1$) is an angle formed by an intersection obtained by extending one side of the aforesaid image center and an end of the tipped part 4 as a reference.

The mounting angle data ($\theta$ direction) of the mounting position data stored in the RAM 40 is compared with the recognition angle data ($\theta_1$) by a comparator, not shown. If an amount of deviation is present, the amount of deviation ($\theta$ direction$-\theta_1$) is calculated by a computer, stored in the RAM 40 and correction of rotation is effected. That is, if such tipped part is the tipped part 4 having a lead, the attraction nozzle 11 is rotated, by the first nozzle rotation positioning device 22, to thereby correct the rotation and the tipped part 4 is adjusted in position. That is, the vertically movable lever 35 is moved down by the drive of the cam, and the pivotal lever is swung downward. The nozzle rotating fitting portion 30 comes into contact with the tapered portion of the groove 11A being fitted provided in the upper portion of the attraction nozzle 11 while being urged by the spring 33. The first nozzle rotating motor 22A is rotated through the amount of deviation ($\theta$ direction$-\theta_1$) and the attraction nozzle 11 thereby rotated to adjust the position of the tipped part 4. It is to be noted that where at the time of fitting between the fitting portion 30 and the groove 11A being fitted, there is present an eccentricity or the like, the X-and Y direction linear guides 42 and 43 are flexibly moved in the X and Y directions, respectively, by the bias of the spring 33 to overcome the eccentricity between the fitting portion 30 and the groove 11A being fitted so that a radial load applied to the attraction nozzle 11 is relieved.

The linear guide may be provided only in one direction, in which case the radial load applied to the attraction nozzle 11 is also relieved.

In the mounting station IV, the print substrate 5 is XY-moved by the XY table 1 so that the tipped part 4 is mounted in position.

In a case where the tipped part 4 attracted on the attraction nozzle 11 is one which requires less accuracy, for example, the tipped part 4 without lead, the mounting operation is done in the following procedure.

First, in the state where the tipped part 4 is attracted is recognized by the recognition device 14, if correction is necessary, it is done by the second nozzle rotation positioning device 23 in the next second nozzle rotation correcting station III. That is, like the first nozzle rotation positioning device 22, the vertically movable lever 35 is moved down by the drive of the cam, and the pivotal lever 37 is swung downward. The nozzle rotating fitting portion 30 is placed in contact with the tapered portion of the groove 11A being fitted and provided in the upper portion of the attraction nozzle 11, while being urged by the spring 33, after which the second nozzle rotating motor 23A is rotated through the amount of deviation ($\theta$ direction$-\theta_1$) whereby the attraction nozzle 11 is rotated to adjust the position of the tipped part 4. The correction is performed in the second nozzle rotation correcting station III because it takes operation time if plural operations (recognition and correction operations) are performed in a single station (the first nozzle rotation correcting station II). With respect to the tipped part 4 without lead, the correcting operation may be separately performed in the first nozzle rotation correcting station II, and with respect to all kinds of tipped parts 4, the correcting operation may be performed in the second nozzle rotation correcting station III.

The tipped part 4, judged by the recognition device 14 to the effect that such part 4 should not be mounted, is moved to and ejected at the ejecting station V by the rotation of the rotary disk 10. For example, where the tipped part 4 is stood upright and attracted by the attraction nozzle 11, or the attracted tipped part 4 is different, the tipped part 4 is ejected without performing the mounting operation in the mounting station IV.

Next, in the nozzle selecting station VI, an attraction nozzle 11, to be used next, is selected by rotating the attraction head portion 12 as the drive gear 16 is rotated after having been meshed with a gear (not shown) provided on the attraction head portion 12.

In the next nozzle origin positioning station VII, adjustment of the origin position of the selected attraction nozzle 11 is carried out. That is, the origin of the attraction nozzle 11, in a rotational direction, as a reference, when the tipped part 4 is attracted, becomes diversified because the rotation of the attraction nozzle 11 has been corrected, while being adjusted to the amount of deviation in the first and second nozzle rotation correcting stations II and III. Therefore, the position of the origin has to be coincided before attraction takes place. Thus, a rotation stop position of the third nozzle rotating motor 24A is set, and the nozzle rotation positioning device 24 is driven to put the origin position of the attraction nozzle 11 in a rotational direction in order. That is, for example, even if the fitting portion 30A and the groove 11A to be fitted are intersected, the fitting portion 30A is first moved down, while being rotated, and the contacting rod 52 biased downwardly by the spring 55 comes into contact with the portion to be contacted 11B (see FIG. 10). The portion to be contacted 11B is urged downward whereby the rotation of the contacting rod 52 caused by the fitting portion 30A is released, that is, the fitting portion 30A becomes idly rotated with respect to the contacting rod 52. Thus, the attraction nozzle 11 is not rotated, together with the rotation of the fitting portion 30A till the fitting portion 30A is fitted in the groove 11A being fitted by the contacting rod 52. That is, the rotation of the fitting portion 30A, in other words, the turning force of the nozzle rotating rod 29, is transmitted to the upper portion 61A of the thrust bearing 61, but not transmitted to the lower portion 61C, by the rolling action of the ball 61B. The fitting portion 30A is coincided with the groove 11A being fitted in direction by the time when the fitting portion 30A rotates through 180° and stops. Accordingly, the fitting portion 30A and the groove 11A being fitted are fitted together while being urged by the spring 55. The attraction nozzle 11 is rotated by the rotation of the fitting portion 30A. In the rotation stopping position, the fitting portion 30A and the groove 11A being fitted can be stopped in the same direction (see FIG. 11). The attraction nozzle 11, after having been stopped from rotation, is always prepared in origin position.

Alternatively, the aforesaid origin position is stored in the RAM 40, and that value, and a portion rotated at the time of correction, are calculated by a computer and the value subtracted from 180°. The nozzle rotating motor 24A is rotated through such value whereby the direction of the groove 11A being fitted is made in coincidence with the direction of the origin position to adjust the attraction nozzle 11 to the origin position.

Furthermore, the nozzle rotating motor 24A may be reversed, through the amount rotated at the time of correction, so as to adjust the attraction nozzle 11 to the origin position.

The mounting operation of the tipped parts 4 is sequentially continued in a manner as described above.

Figure 13:
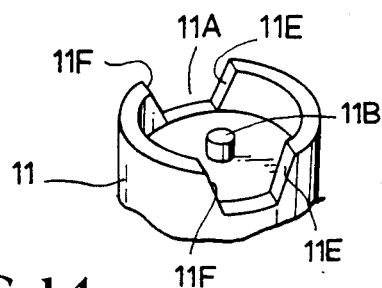
FIG. 13 is a perspective view of the groove to be fitted.
Figure 14:
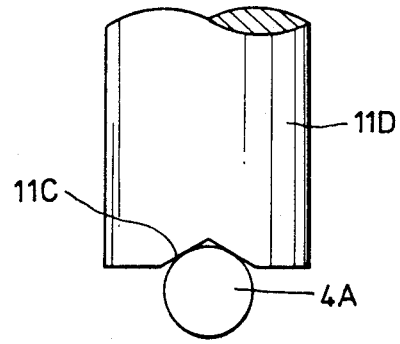
FIG. 14 is a view showing a directional attraction nozzle having a cylindrical tipped part attracted thereon.

While, in the above description of the correction of rotation, a description has been made of the case where, because the nozzle rotating fitting portion 30 is coincided with the direction of the groove 11A being fitted, the fitting portion 30 is merely moved down to fit in groove 11A being fitted, it is to be noted that even if the fitting portion 30 is eccentric with the 11A groove being fitted (see FIG. 12), if the fitting portion 30 is in contact with even one surface of both tapered surfaces 11E and 11F forming the groove 11A being fitted, as shown in FIG. 13, the groove fitted 11A being fitted can be rotated in a direction coincided with the direction of the tapered surface of the fitting portion 30. Therefore, the attraction nozzle 11 can be rotated in a direction as desired. Accordingly, even with respect to the directional attraction nozzle 11D formed with the V-shaped groove 11C for attracting the cylindrical tipped part 4, as shown in FIG. 14, for example, the 11A groove being fitted is set so as to have the same direction as that of the V-shaped groove 11C whereby the axial direction of the part 4A can be coincided with the V-shaped groove 11C while adjusting to a style of the cylindrical tipped part 4A in the part supply device 7. The stopping direction of the groove 11A being fitted becomes the stopping direction of the V-shaped groove 11C to provide a positive attraction of the parts.

While in the aforementioned embodiment, the springs 33 and 77, as the cushion means, are provided on the side of the fitting portions 30 and 74, it is to be noted that they may be provided on the side of the groove 11A to be fitted, that is, on the side of the attraction nozzle 11. In this case, the spring may be provided between the lower surface of the upper portion of the attraction nozzle 11 formed with the groove 11A to be fitted and the upper surface of the attraction head portion 12, for example.

Moreover, the aforementioned brake means is provided on the side of the attraction head portion 12 so as to come into contact with the upper portion of the attraction nozzle 11 to control the rotation of the attraction nozzle.

Furthermore, while in the present embodiment, the linear guides 42 and 43 are provided on the first and second nozzle rotation positioning devices 22 and 23, it is to be noted that a linear guide may be provided also on the third nozzle rotation positioning device 24.

With the above-described arrangement, according to the present invention, positioning can be made naturally and positively while in the conventional construction in which when the driven rotational member is rotated by the driving rotational member, the driving rotational member is fitted into the inner peripheral frictional surface of the driven rotational member for rotation, a radial strain occurs in the driving rotational member due to the eccentricity at the time of rotation.

What is claimed is:

1. An electronic parts mounting apparatus which, on the basis of a recognition result of an attitude of tipped electronic parts obtained by a recognition device, changes the attitude of said parts in a rotational direction, said apparatus comprising a removing nozzle, formed in its upper portion with a groove to be fitted, for attracting and holding at its lower end said parts to be recognized by said recognition device; a vertically movable and rotatable nozzle rotating means for changing the attitude of said parts in a rotational direction on the basis of a recognition result obtained by said recognition device, said nozzle rotating means being provided above said removing nozzle and having a fitting portion to be fitted in said groove to be fitted; a cushion means mounted on one of said nozzle rotating means and said removing nozzle for pressing said fitting portion against said groove to be fitted when said nozzle rotating means is moved down into contact with said groove of said nozzle to be fitted; and a sliding means for fitting said fitting portion into said groove to be fitted while sliding said fitting portion at least in one direction while being adjusted to said groove to be fitted by the bias of said cushion means.

2. An electronic parts mounting apparatus according to claim 1, wherein said sliding means is a linear guide.

3. An electronic parts mounting apparatus according to claim 1, wherein said nozzle rotating means comprises a nozzle rotating member formed with a longitudinal slot and rotatable by a driving source, and a nozzle rotating rod having a fitting portion at a lower end thereof and vertically movable within said rotating member when a pin is fitted into said longitudinal slot.

4. An electronic parts mounting apparatus according to claim 3, wherein said nozzle rotating rod is formed with an engaging portion, and a spring, as a cushion means, is provided between said engaging portion and said nozzle rotating member.

* * * * *